United States Patent [19]
Kita

[11] Patent Number: 4,873,557
[45] Date of Patent: Oct. 10, 1989

[54] MIS FET AND PROCESS OF FABRICATING THE SAME

[75] Inventor: Akio Kita, Tokyo, Japan

[73] Assignee: Oki Electric Industry Co., Ltd., Tokyo, Japan

[21] Appl. No.: 67,413

[22] Filed: Jun. 19, 1987

[30] Foreign Application Priority Data

Jul. 3, 1986 [JP] Japan .................. 61-155089

[51] Int. Cl.⁴ .......................... H01L 29/78
[52] U.S. Cl. .................. 357/23.1; 357/23.3; 357/23.11
[58] Field of Search ........... 357/23.1, 23.3, 23.11

[56] References Cited

U.S. PATENT DOCUMENTS

| | | | |
|---|---|---|---|
| 4,505,024 | 3/1985 | Kawate et al. | 357/23.1 |
| 4,593,454 | 6/1986 | Baudrant et al. | 357/23.1 |
| 4,698,659 | 10/1987 | Mizutani | 357/23.1 |
| 4,737,828 | 4/1988 | Brown | 357/23.11 |

FOREIGN PATENT DOCUMENTS

| | | | |
|---|---|---|---|
| 54-139488 | 10/1979 | Japan | 357/23 |
| 61-220468 | 9/1986 | Japan | 357/23.1 |

OTHER PUBLICATIONS

IEEE Transactions on Electron Devices, vol. ED-29, No. 4, Apr. 1982, pp. 590-596, "Fabrication of High-Performance LDDFET's with Oxide Sidewall-Spacer Technology", Tdsng et al.

Primary Examiner—Rolf Hille
Assistant Examiner—Hoanganh Le
Attorney, Agent, or Firm—Spencer & Frank

[57] ABSTRACT

An LDD MIS FET comprises a silicide over the lightly doped regions to reduce the parasitic resistance and to prevent the depletion of the lightly-doped regions, reducing the hot carrier injection effect. By the provision of the silicide, the overall parasitic resistance can be made low. Moreover, the increase in the resistance of the lightly-doped region due to the negative charge being trapped at the interface of or in the oxide film over the lighty-doped region and the resultant degradation in the characteristic are eliminated.

6 Claims, 5 Drawing Sheets

PRIOR ART

MIS FET AND PROCESS OF FABRICATING THE SAME

BACKGROUND OF THE INVENTION

The present invention relates to a MIS (Metal Insulator Semiconductor) FET (Field Effect Transistor) of a miniature structure with reduced hot carrier effect.

To increase the degree of integration, the size of the MIS FET must be reduced. When the channel length of a MIS FET is reduced, the electric field proximate to the drain is intensified and hot carriers are generated. The hot carriers can be injected into the gate dielectric film deteriorating the device characteristics. To alleviate the intensity of the electric field, the LDD (Lightly Doped Drain) structure is employed.

An example of the LDD structure is disclosed in the IEEE Transactions on Electron Devices, Vol. ED-29, No. 4, April 1982, pp. 590–596, "Fabrication of High-Performance LDDFET's with Oxide Sidewall-Spacer Technology", Tsang, et al. This LDDFET is described with reference to FIGS. 1A to 1F.

As illustrated in FIG. 1A, a silicon substrate 1 is prepared, on which a field oxide film 2, a gate oxide film 3, a polycrystalline silicon (poly-Si) film 4, and a CVD $SiO_2$ film S($SiO_2$ film formed by chemical vapor deposition) are formed in turn.

Next, as illustrated in FIG. 1B, the CVD $SiO_2$ film 5 and the poly-Si film 4 are patterned. The patterned polySi film 4 constitutes a gate electrode.

Next, as illustrated in FIG. 1C, ion-implantation is performed using the patterned films 5 and 4 as a mask (i.e., by self-alignment) to form N-regions (lightly-doped regions) 6 in the silicon substrate 1.

Next, as illustrated in FIG. 1D, a CVD $SiO_2$ film 7 is deposited over the entire surface.

Next, as illustrated in FIG. 1E, RIE (reactive ion etching) is performed to form sidewalls 8.

Next, as illustrated in FIG. 1F, ion-implantation is performed using the patterned films 5 and 4, and the sidewalls 8 as a mask (i.e., by self-alignment) to form N+ regions (heavily-doped regions) 9.

Subsequently, an interlayer insulating film is deposited, and a contact is opened and an Al (aluminum) conductor layer 10 is formed to obtain an LDDFET as shown in FIG. 2.

In this way, the lightly-doped regions are formed under the sidewalls 8 to alleviate the electric field intensity.

The above-described conventional LDD structure has a problem in that if the N− region is formed to minimize the electric field near the drain, the impurity concentration of the N− region is on the order of $10^{17}$ $cm^{-3}$, so that the parasitic resistance between the source and the drain is increased and the conductance is decreased. Moreover, when a negative charge is trapped in the oxide film over the N− region, the N− region is depleted and a substantial degradation results.

SUMMARY OF THE INVENTION

An object of the invention is to provide an LDD MIS FET in which the hot carrier injection effect is small and the source and drain parasitic resistance is small, and which has a superior performance.

An LDD MIS FET according to the invention comprises a silicide coating over the lightly doped regions to reduce the parasitic resistance and to prevent the depletion of the lightly-doped regions, reducing the hot carrier injection effect. The impurity concentration in the lightly-doped region can be reduced to a level that minimizes the electric field intensity. Moreover, the increase in the resistance of the lightly-doped region due to the negative charge being trapped at the interface of or in the oxide film over the lightly-doped region and the resultant degradation in the characteristic are eliminated.

DESCRIPTION OF THE PREFERRED EMBODIMENTS

Figure 1A:
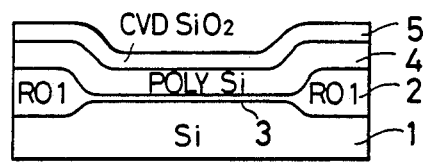
FIGS. 1A to 1F are cross sections showing various steps in the fabrication of a prior art MIS FET.
Figure 1B:
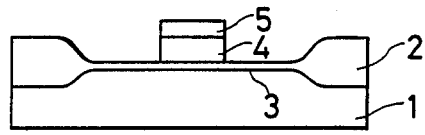
Figure 1C:
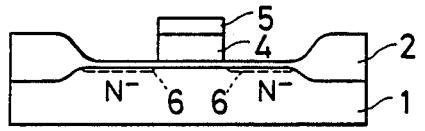
Figure 1D:
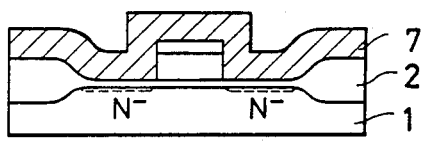
Figure 1E:
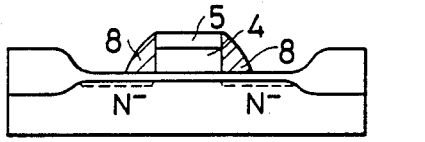
Figure 1F:
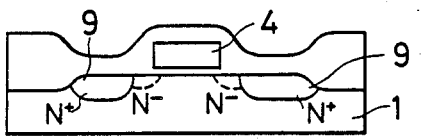
Figure 2:
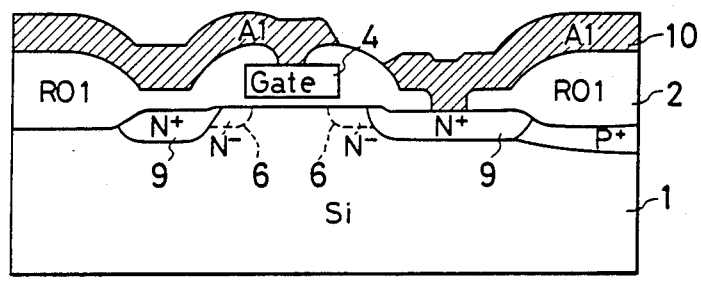
FIG. 2 is a cross section showing a completed prior art MIS FET.
Figure 3:
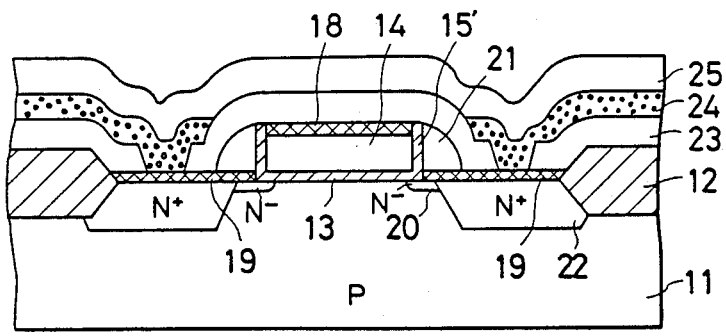
FIG. 3 is ross section showing a MIS of an embodiment of the invention.

FIG. 3 shows an embodiment of an LDD MIS FET according to the invention.

As illustrated, the MIS FET comprises a P-type silicon substrate 11, a gate insulation film 13 formed on the substrate 11, and a gate electrode 14 formed on the gate insulation film 13, i.e. separated from the substrate 11 by the gate insulation film 13. Provided on the sides of the gate electrode 14 are oxide films 15' formed by thermal oxidation of the gate electrode polysilicon.

A titanium silicide film 18 is formed on the gate electrode 14 and titanium silicide films 19 are formed on the doped regions in the substrate 11 adjacent the gate electrode 14. The titanium silicide films 18 and 19 are electrically insulated from each other.

Each of the N-type doped regions constituting the source and drain comprises two parts. The first part 20 adjacent the channel under the gate electrode 14 is an N− region formed by doping phosphorus (P) at a low dose. A second part 22 separated from the channel by the first part 20 is an N+ region formed by ion-implantation using the gate electrode 14 and a spacer 21 as a mask, i.e., by self-alignment.

The spacer 21 is formed on each side of the gate electrode 21 by subjecting a layer of polysilicon to an anisotropic etching.

An inter-layer insulating film 23, a metal wiring conductor 24 and a protective layer 25 are also provided.

Fabrication of the MIS FET is shown in and described with reference to FIGS. 4A to 4H.

Figure 4A:
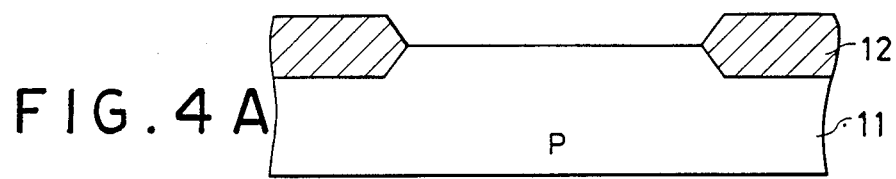
FIGS. 4A to 4H are cross sections showing various steps in the fabrication of the MIS FET of the embodiment of FIG. 3.

First, a P-type silicon substrate 11 is prepared, and field oxide films 12 of a thickness of about 700 nm are formed by selective oxidation, i.e., local oxidation of silicon (LOCOS) to result in a structure shown in FIG. 4A.

Figure 4B:
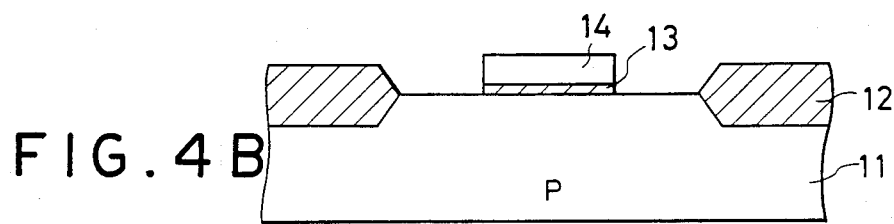

Next, a gate insulation film 13 of a thickness of about 25 nm is formed on the exposed surface of the silicon substrate 11 in an oxidizing atmosphere of 900° to 1000° C. Then a polysilicon layer 14 (which will become a gate electrode) is deposited on the gate insulation film 13 to a thickness of about 300 to 400 nm by CVD (chemical vapor deposition). To impart conductivity, the polysilicon layer 14 is doped with phosphorus (P) at a concentration of $3 \times 10^{20}$ cm$^{-3}$. Next, a photolithography technique is u to form a patterned photore t layer (not shown), and using the patterned photoresist layer as a mask, an etching is performed to remove the unnecessary part (part other than the gate electrode part) of the polysilicon layer. For this etching, a dry etching apparatus with an SF$_6$ gas is employed. Using the patterned gate electrode as a mask, the exposed gate oxide is etched. The etchant used for this etching is an aqueous solution of hydrofluoric acid. The resultant structure is shown in FIG. 4B.

Figure 4C:
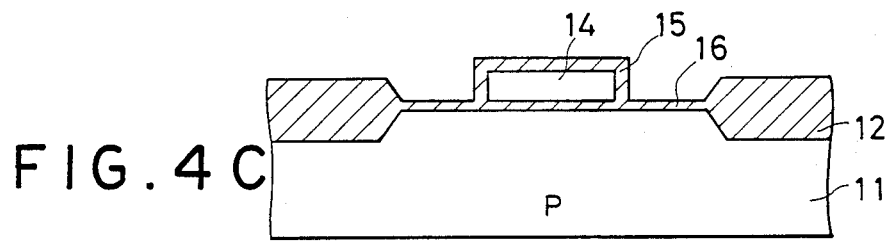
Figure 4D:
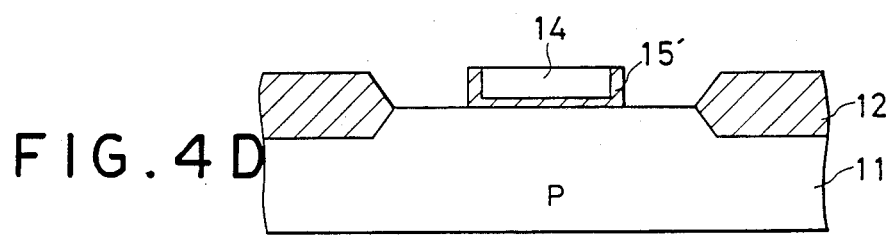

Next, a wet oxidizing atmosphere of relatively low temperature of about 850° C. is used to form a relatively thick oxide film 15 on the polysilicon layer 14 and a relatively thin oxide film 16 on the exposed surface of the silicon substrate 11. The thickness ratio between the oxide film on the polysilicon 14 and the silicon substrate 11 depend mainly on the oxidizing temperature, partial pressure of water vapor in the oxidizing atmosphere, and the impurity concentration in the polysilicon. In the embodiment described, the oxidizing temperature was 850° C., the partial pressure of water vapor was 0.3 atm., and the phosphorus concentration in the polysilicon was $3 \times 10^{20}$ cm$^{-3}$. Under these conditions, a 30 nm thick oxide film was formed on the silicon substrate while a 120 nm thick oxide film was formed on the polysilicon. The resultant structure is shown in FIG. 4C.

Next, an anisotropic etching is performed using a reactive ion ing apparaus with C$_2$F$_6$ and F$_3$ gases to leave the oxide films 15' on the sides of the polysilicon 14. The remaining oxide films 15' shown in FIG. 4D act as spacers.

Figure 4E:
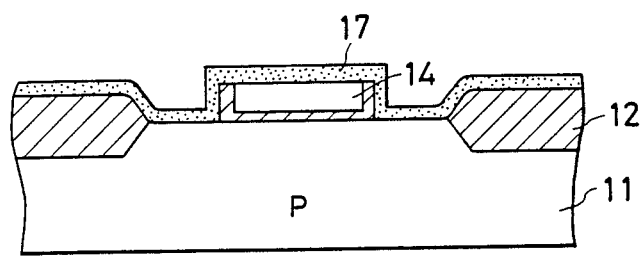

Next, a titanium film 17 of a thickness of about 100 nm is formed throughout the entire surface by sputtering, as shown in FIG. 4E.

Figure 4F:
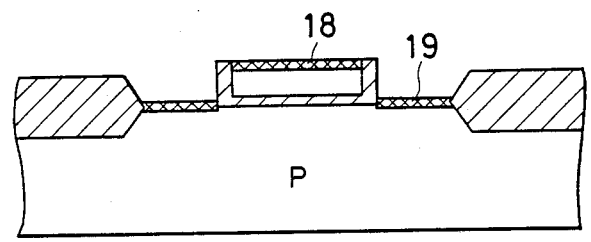

Next, the titanium film 17 is made to react with silicon to form a titanium silicide film. This can be implemented by heating in an argon (Ar) atmosphere at a temperature of 750° C. for 100 sec. For the heating, halogen lamps were used. The titanium silicide films are thus formed on the polysilicon 14 and the silicon substrate 11. The titanium film on the oxide film does not react to form titanium silicide. The unreacted titanium film on the oxide film is removed to leave the titanium silicide film 18 on the polysilicon 14 and the titanium silicide films 19 on the silicon substrate 11. The resultant structure is shown in FIG. 4F.

Figure 4G:
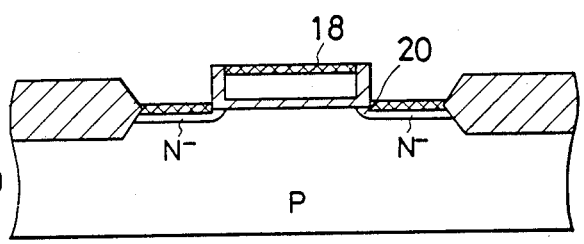

Next, ion implantation of phosphorus is performed using the polysilicon as a mask to form N$^-$ regions 20. The dose of phosphorus is about $5 \times 10^{12}$ cm$^{-2}$ and the implantation energy is 20 KeV to implant ions in the shallow ranges. The resultant structure is shown in FIG. 4G.

Figure 4H:
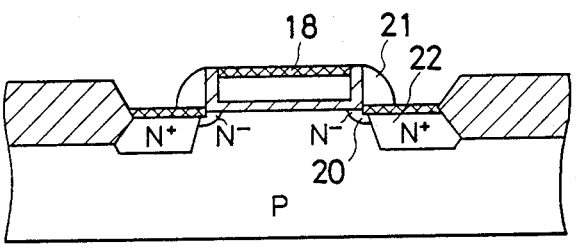

Next, an oxide (SiO$_2$) film is deposited by CVD to a thickness of 300 to 500 nm, and anisotropic etching in the form of reactiv ion etching is performed to m spacers 21 on the sides of the polysilicon electrode. The width of the spacers 21 is about 0.2 to 0.3 micrometer. Ion implantation of arsenic (As) is then performed using the polysilicon and the spacers 21 as a mask to form N$^+$ regions 22. The dose of arsenic is $5 \times 10^{15}$ cm$^{-3}$. The resultant structure is shown in FIG. 4H.

Subsequently, an inter-layer insulating film 23 is formed, a contact hole is opened, a metal wiring conductor 24 of aluminum is formed, and finally a protective film 25 is formed to complete the process.

Figure 5:
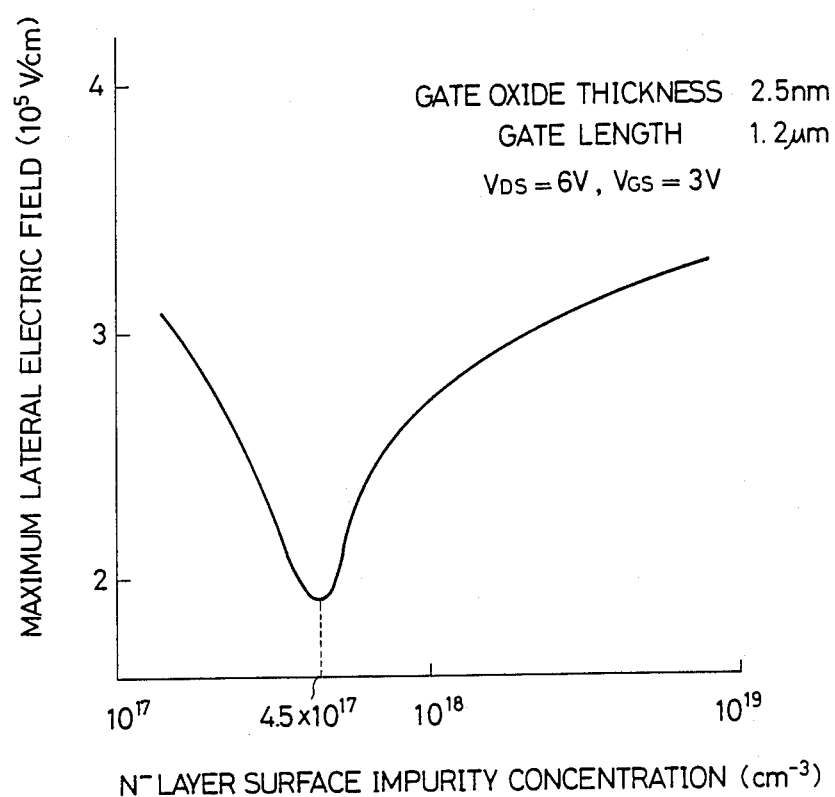
FIG. 5 is the diagram showing a relationship between the surface impurity concentration of the N− region and the maximum electric field in the lateral direction.

FIG. 5 shows the relationship between the impurity concentration at the surface of the N$^+$ regions and the maximum lateral electric field. Here, the gate oxide film is 25 nm thick, the gate length is 1.2 micrometers, the drain-source voltage V$_{DS}$ is 6V, and the gate-source voltage V$_{GS}$ is 3V. It is seen that to minimize the electric field, the impurity concentration of the N$^-$ regions should be $4.5 \times 10^{17}$ cm$^{-3}$.

In comparison, in the conventional MIS FET, the impurity concentration could not be made as low as $4.5 \times 10^{17}$ cm$^{-3}$. This is because at such a low impurity concentration, the parasitic resistance is too large. The result is that the alleviation of the electric field is inadequate and the degradation due to hot carriers is a problem. In contrast, the provision of the silicide films according to the invention permits the impurity concentration to be lowered to the level of ($4.5 \times 10^{17}$ cm$^{-3}$) giving the minimum electric field. The parasitic resistance is kept low. Thus, the hot carrier injection effect is reduced without an increase in the parasitic resistance or decrease in the conductance.

Moreover, in the conventional MIS FET, when a negative charge is trapped at the interface of or in the oxide film over the N$^-$ regions, the N$^-$ regions are depleted. This phenomenon is also prevented by the invention.

In the embodiment described, titanium silicide is used as the metal silicide. But other silicides of high melting-temperature metals such as tungsten silicide and molybdenum silicide can also be used. Platinum silicide can also be used.

The invention is not limited to the embodiments described above, but various modifications can be made without departing from the scope and the spirit of the invention.

What is claimed is:

1. An LDD MIS field effect transistor formed at the surface of a silicon substrate, comprising
   a channel region in part of the substrate;
   a gate insulating film formed on the channel region;
   a gate electrode formed on the gate insulating film;
   a lightly-doped region formed in the substrate adjacent to an end of the channel region;
   a heavily-doped region formed in the substrate, said heavily-doped region being separated from the channel region by the lightly-doped region;
   a metal silicide film formed on part of the lightly-doped region and the heavily doped region; and
   a sidewall spacer formed on a side of the gate electrode, said sidewall spacer being used as a mask during ion implantation for forming said heavily-doped region, such that said metal silicide separates said sidewall spacer from the substrate.

2. A transistor according to claim 1, wherein the metal silicide is a silicide of a refractory metal.

3. A transistor according to claim 1, wherein the metal silicide is platinum silicide, titanium silicide, tungsten silicide, or molybdenum silicide.

4. A transistor according to claim 1, wherein the impurity used for the formation of the doped regions is an N-type impurity.

5. A transistor according to claim 1, wherein the metal silicide is a silicide of a metal that has a melting point of at least 1,650 degrees Centigrade.

6. A lightly-doped drain/source MIS field effect transistor formed in a semiconductor substrate, comprising:

a gate insulating film formed on the substrate;

a gate electrode formed on the gate insulating film;

first and second lightly-doped regions formed in the substrate adjacent opposite portions of said gate electrode;

first and second heavily-doped regions formed in the substrate, each of said first and second heavily-doped regions being separated from a respective opposite portion of said gate electrode by a corresponding lightly-doped region;

first and second sidewall spacers each formed on the gate insulating film and on a respective opposite portion of said gate electrode; and first and second metal silicide films each disposed between a respective sidewall spacer and said substrate thereby preventing depletion of said lightly-doped regions.

* * * * *